US 6,642,460 B2

(12) United States Patent
Dunne et al.

(10) Patent No.: US 6,642,460 B2
(45) Date of Patent: Nov. 4, 2003

(54) SWITCH ASSEMBLY EMPLOYING AN EXTERNAL CUSTOMIZING PRINTED CIRCUIT BOARD

(75) Inventors: John Edmund Dunne, Cornelius, NC (US); Martin John Tatara, Zebulon, NC (US)

(73) Assignee: Eaton Corporation, Cleveland, OH (US)

( * ) Notice: Subject to any disclaimer, the term of this patent is extended or adjusted under 35 U.S.C. 154(b) by 1 day.

(21) Appl. No.: 10/056,240

(22) Filed: Jan. 23, 2002

(65) Prior Publication Data

US 2003/0136656 A1 Jul. 24, 2003

(51) Int. Cl.[7] .......................... H01H 9/02; H01R 12/32
(52) U.S. Cl. ...................... 200/51.03; 200/292; 439/82; 361/781
(58) Field of Search ................................ 200/280, 281, 200/284, 292, 51.12, 51.06, 51.03; 439/189, 283, 952, 82; 361/781, 837

(56) References Cited

U.S. PATENT DOCUMENTS

| 5,059,130 A | * | 10/1991 | Miller ..................... 439/82 X |
| 5,252,937 A | * | 10/1993 | Bernier et al. .......... 361/781 X |
| 5,642,806 A | | 7/1997 | Karadimas |
| 5,833,048 A | | 11/1998 | Dilly |
| 6,071,136 A | | 6/2000 | Bricaud et al. |
| 6,089,880 A | * | 7/2000 | Miyagawa et al. ........... 439/82 |
| 6,120,328 A | | 9/2000 | Bricaud et al. |

OTHER PUBLICATIONS

Commercial Controls Division, "NGR" New Generation Rocker Switches, www.commercialcontrols.eaton.com/ngr.htm, Oct. 30, 2001, 3 pp.

\* cited by examiner

*Primary Examiner*—Renee Luebke
(74) *Attorney, Agent, or Firm*—Martin J. Moran

(57) ABSTRACT

An interchangeable printed circuit board having electrical components is attached externally proximate to the base of a switch to customize switch performance. The circuit board includes openings which slide over and electrically engage the terminals of the switch proximate the base, leaving the remainder of the terminals exposed and available for plug-in or solder electrical connection within an electrical system. The openings may be copper contact members having fingers which engage and electrically connect to the switch terminals.

2 Claims, 5 Drawing Sheets

SWITCH ASSEMBLY EMPLOYING AN EXTERNAL CUSTOMIZING PRINTED CIRCUIT BOARD

BACKGROUND OF THE INVENTION

1. Field of the Invention

This invention relates to electrical switches and, more particularly, to switch assemblies including one or more electrical components electrically connected to switch terminals.

2. Background Information

Electrical switches employed in low voltage applications, such as rocker switches used in automobiles, have a rocker actuator member, pivotal about an axis and mounted on a switch housing. The actuator is pivoted by a user until contact is made with one of two stationary contacts, thus completing the electrical circuit and providing electrical current for such functions as energizing an electric motor to open a vehicle window or to adjust a side view mirror. A self-centering mechanism, such as a spring, returns the switch to the neutral position. On the base of the switch there is typically a plurality of electrical connecting terminals. These terminals are often connected to complete the electrical circuit, within an automobile electrical system, by soldering wiring or plugging in wiring to the terminals. Similar switches are also used in a variety of low voltage applications outside of the automotive industry.

Typically, such switches are limited in functionality by the number and variety of electrical components that can be electrically connected within the switch housing. Due to the ever-increasing demands in the automotive industry for more and more electrical operating, monitoring, and control devices, the space required for installation of these devices continuously decreases while demand for low-cost, miniaturized but complex versions of such elements, especially switches, increases. Constrained by the switch housing size and permanent soldering of these internal electrical components, existing switches are limited in scope and incapable of performing many complex functions.

Additionally, the existing method of constructing a variety of switches, each with different internally soldered electrical components, is a time consuming and costly process.

There is a need, therefore, to provide a low cost device to improve performance of existing switches.

SUMMARY OF THE INVENTION

These needs and others are satisfied by the invention, which is directed to a switch assembly including an external customizing printed circuit board electrically connected to the terminals on the base of an electrical switch. Electrical components, such as resistors and other electronic components, may be soldered to the circuit board, as a subassembly. This circuit board subassembly may be slid over the electrical terminals on the base of an existing switch, thus modifying and customizing its performance as desired, and as defined by the electrical components soldered thereon.

The circuit board may be interchangeable, thus permitting a single switch to perform a variety of functions depending on the particular circuit board attached and the electrical components contained thereon.

The circuit board may contain a plurality of openings corresponding to the number of electrical terminals on the switch base. One or more openings may have electrically conductive traces electrically connecting the components contained on the circuit board, such as resistors. One or more openings may also be sized to securely engage the circuit board with the terminals and to provide electrical connections between the traces and the terminals. Therefore, no soldering exists between the circuit board and the switch terminals, and the circuit board is readily attached to and/or interchangeable with the switch.

As one aspect of the invention, the circuit board may be slid over the switch terminals and engagingly disposed proximate to the base of the switch housing, thus permitting the switch terminals to remain exposed and available for plug-in or soldered electrical connection to an electrical system.

As another aspect of the invention, the circuit board may be hermetically sealed, thus preventing the ingress of damaging environmental elements, such as water or dust.

As another aspect of the invention, the circuit board openings may include a contact member, such as a copper contact strip, which is attached to the circuit board and forms the connection to the corresponding electrical terminal on the switch base.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention relates to switches such as rocker actuated type switches and other switches of the type employed for low voltage applications; for example, without limitation, for operator control and adjustment of vehicle accessories including automatic windows, door locks, and side view mirrors. However, it will be evident to those skilled in the art that the invention is also applicable to other types of switches for a wide range of applications, as well.

Figure 1:
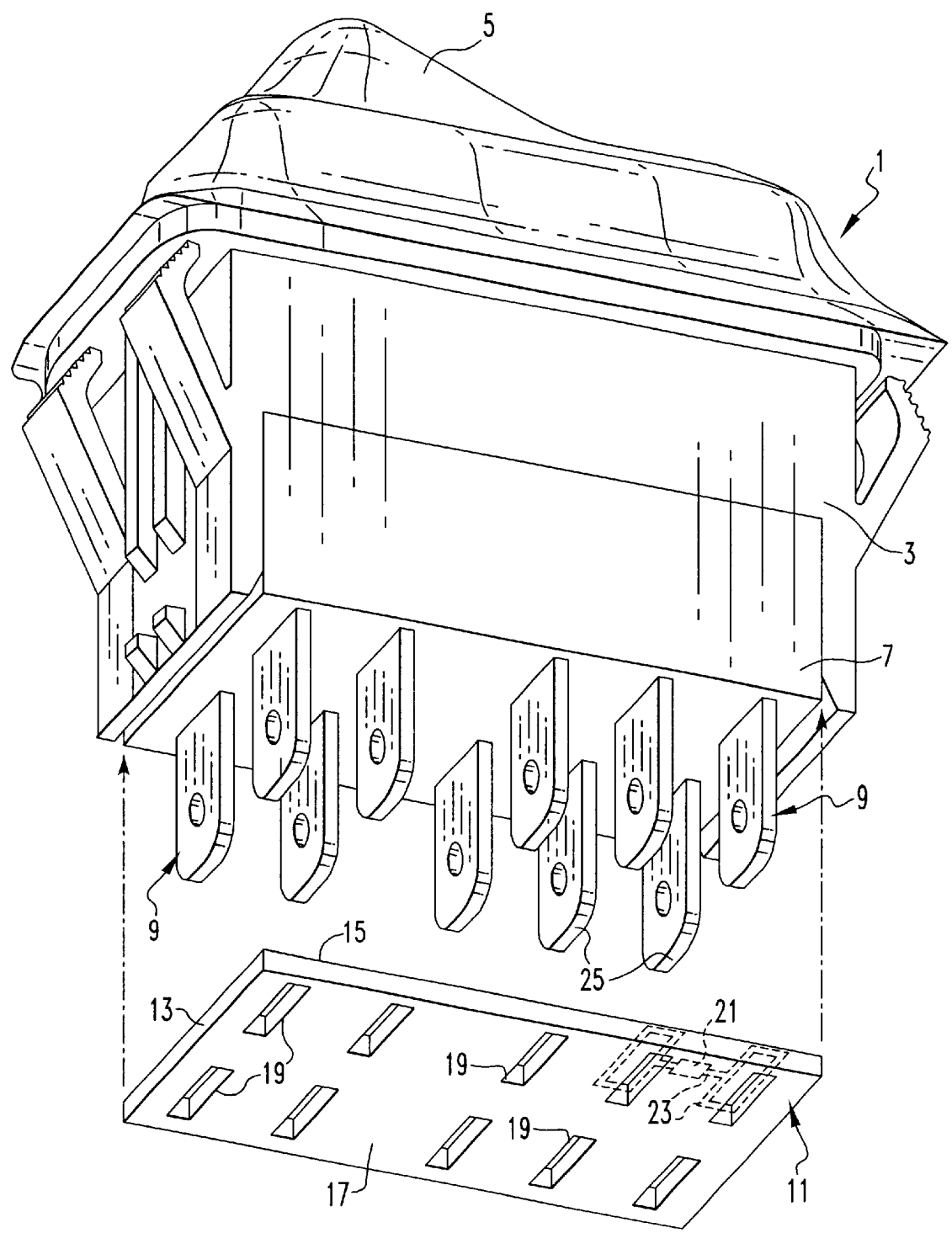
FIG. 1 is an exploded, isometric view of a rocker switch incorporating an external customizing printed circuit board in accordance with the present invention.

As shown in FIG. 1, a switch 1 is comprised of a housing or frame 3, an actuator such as rocker button 5, and a base 7 with a plurality of electrically conductive terminals 9. To increase the functionality and versatility of the switch 1, an interchangeable printed circuit board 11 is structured for addition to the base 7 of the switch 1 for customization thereof. The printed circuit board 11 consists of a substrate 13 having first and second generally planar opposite faces 15,17. A number of through openings 19 in the substrate 13 extend between the first and second faces 15,17. At least one through opening 19 is sized to slide over and electrically engage one or more of the terminals 9 of the switch 1. One or more electrical components 21 (one is shown in hidden line drawing in FIG. 1) are electrically connected to at least one (e.g., face 15) of the first and second faces 15,17 of the substrate 13, in order to customize the switch and improve switch performance. Electrically conductive traces 23 provide electrical connection between the components 21 and the openings 19.

Figure 2:
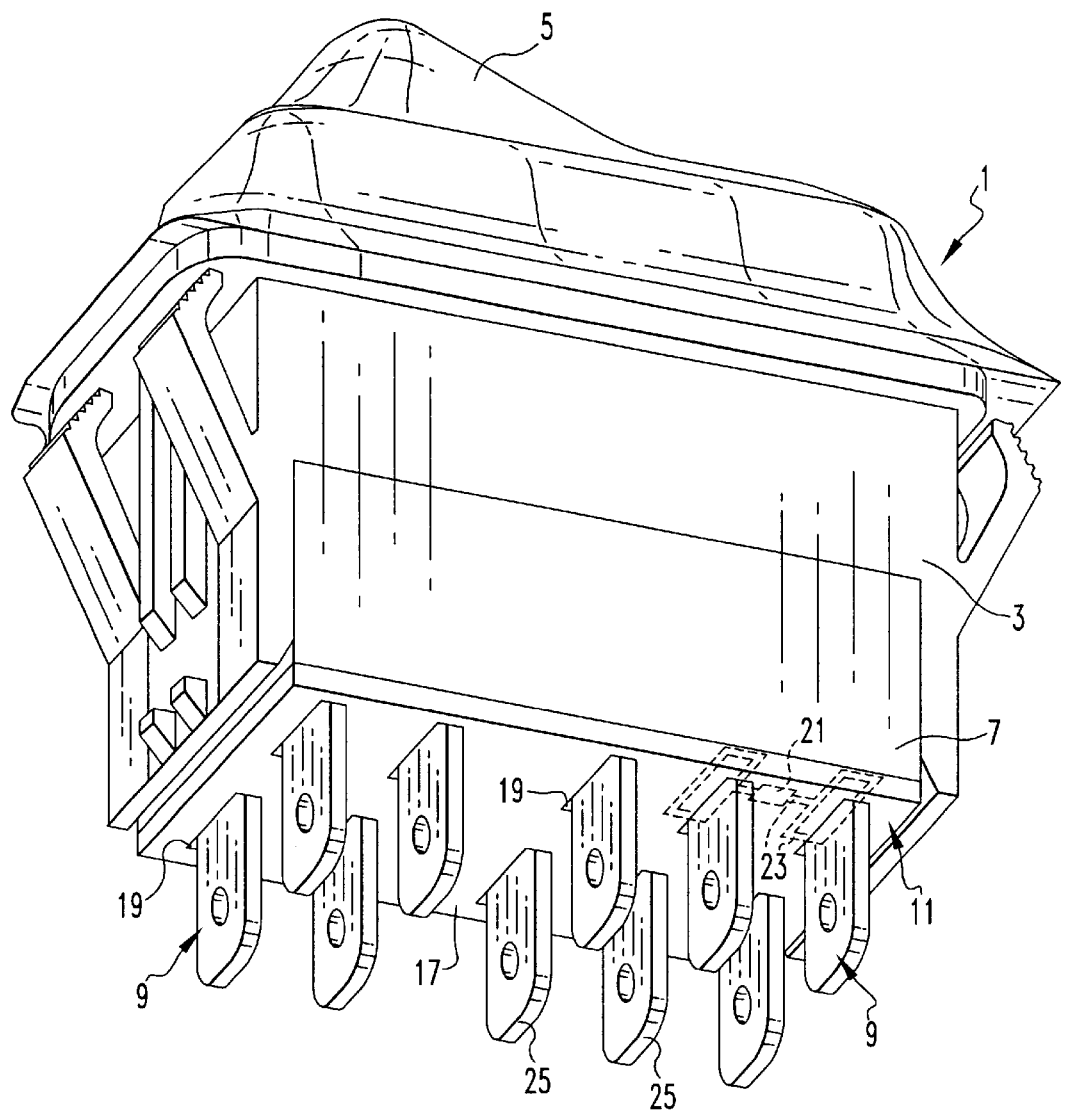
FIG. 2 is an isometric view of the rocker switch assembly of FIG. 1.
Figure 4:
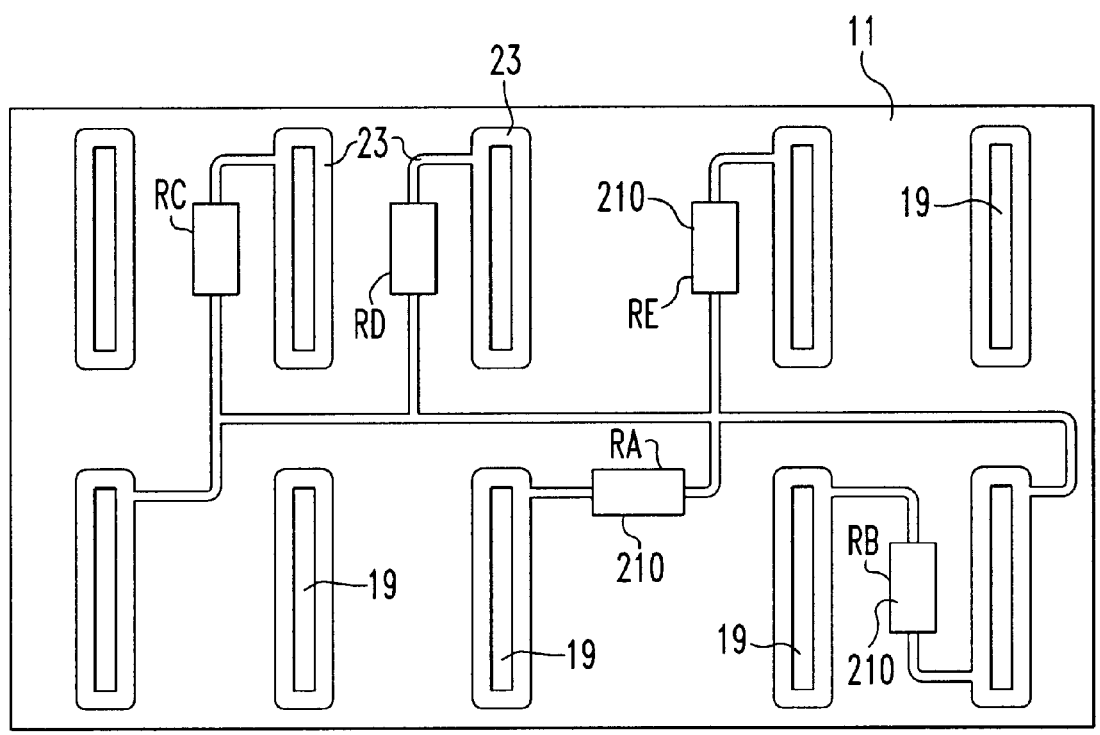
FIG. 4 is a plan view of circuitry and electrical components contained on an external customizing printed circuit board and electrically conductive traces located at each circuit board opening, in accordance with an embodiment of the invention.

In one embodiment of the invention, illustrated in FIGS. 1 and 2, the printed circuit board 11 is assembled to the rocker switch 1 and contains the same number of through openings 19 as there are switch terminals 9. Each opening 19 has an associated electrically conductive trace 23 and is suitably sized in order that friction maintains electrical connection to the corresponding switch terminal 9. The traces 23 also connect the openings 19 to the electrical components 21, which in this embodiment are resistors 210 (as shown in FIG. 4). The traces 23 are made of a suitable conductor, such as copper, or copper with gold or other suitable plating (e.g., tinned), and are suitably fastened to the circuit board 11 and are formed using a suitable process, such as etching. A wide range of other conductive materials and alternative methods may be employed to create the traces 23. The circuit board 11 is preferably hermetically sealed using conformal coating or any other suitable sealing process, to prevent the ingress of damaging elements. If the conductive traces 23 and electrical components 21 are only on the first face 15 of the circuit board 11, as shown in FIG. 1, then the circuit board 11 is preferably disposed with the first face 15 facing the base 7 of the switch 1 to provide additional protection for the components 21.

Referring to FIG. 2, the printed circuit board 11 is disposed proximate to the base 7 of the switch 1. The circuit board 11 is preferably relatively thin, with the same circumference as the switch base 7. This orientation permits the free ends 25 of the electrically conductive switch terminals 9 to be available for plug-in electrical connection. By way of example, the circuit board 11 for use with an automobile rocker switch 1, shown in FIGS. 1, 2, 3A and 4, is made of a material commonly known as FR4 and is only about 0.031 inches thick. In this example, the circuit board 11 width and length are about 0.848 inches by 1.5 inches, respectively, thereby matching the dimensions of the switch base 7. Overall thickness of the switch circuit board 11 assembly, after five resistors 210 (shown in FIG. 4 with reference characters RA, RB, RC, RD and RE) and the desired traces 23 (FIG. 4) are attached, is about 0.060 inches. Therefore, as best shown in FIG. 2, only a nominal portion of the terminals 9 is covered, leaving the remainder available for plug-in or solder electrical connection to the automobile electrical system (not shown).

Figure 3A:
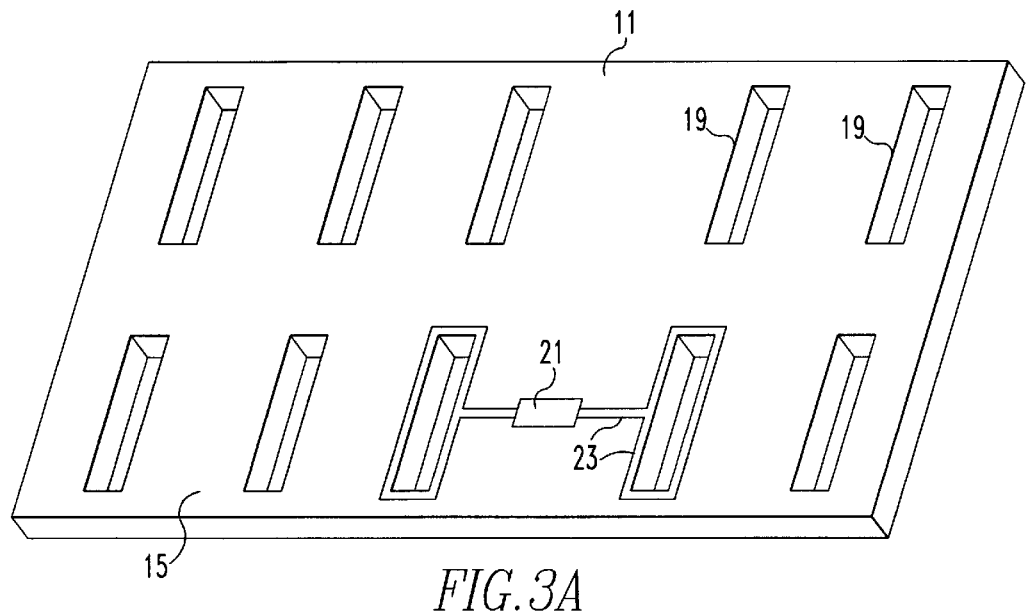
FIG. 3A is a simplified, isometric view of the printed circuit board of FIG. 1.
Figure 3B:
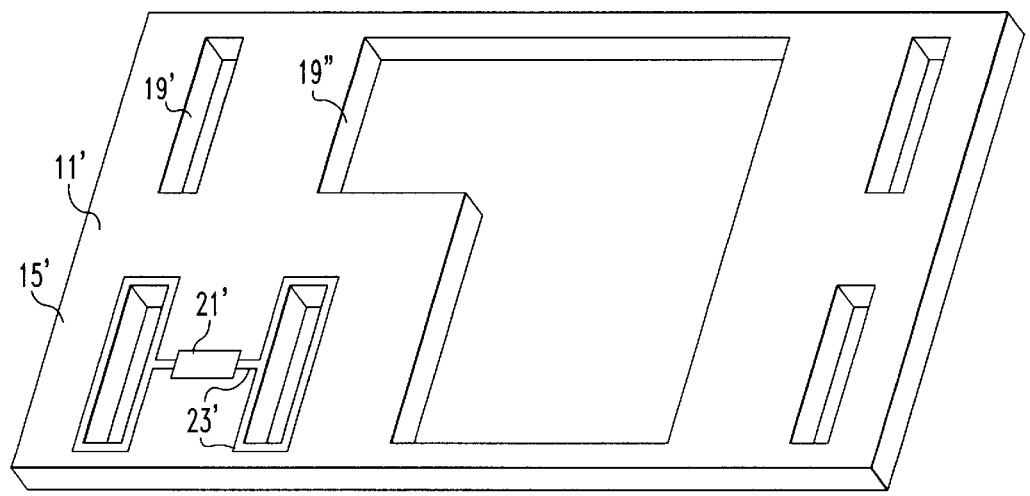
FIG. 3B is a simplified, isometric view of an alternate embodiment of the invention having circuit board through openings of different sizes and shapes.

As shown in FIG. 3A, the printed circuit board 11 contains the same count of through openings 19 as there are terminals 9 on the base 7 of the switch 1 of FIG. 1. Furthermore, each opening 19 is sized to electrically engage a corresponding terminal 9. However, it will be appreciated that any number of variations in circuit board size, as well as variations in through opening location and/or size, are possible. FIG. 3B shows one possible variation in which several of the terminals 9 (FIG. 1) are not connected to the circuit board 11'. The circuit board 11' of FIG. 3B has several terminal-engaging through openings 19' and one centrally located, relatively large opening 19", thus demonstrating that it is not a necessity for all of the terminals 9 to be electrically engaged. Similar to the circuit board 11, the circuit board 11' also includes a first face 15', a second face (not shown), one or more components 21' (only one is shown), and conductive traces 23'.

Figure 5:
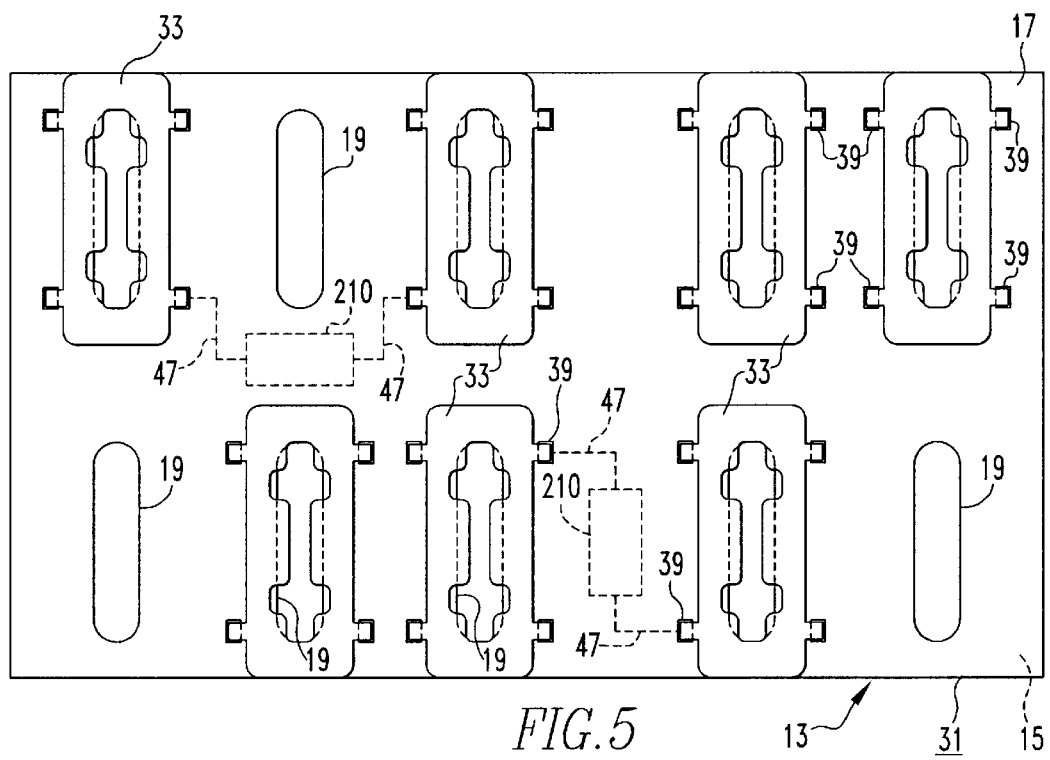
FIG. 5 is a simplified, isometric view of a printed circuit board including a plurality of copper contact strips in accordance with another embodiment of the invention.
Figure 6:
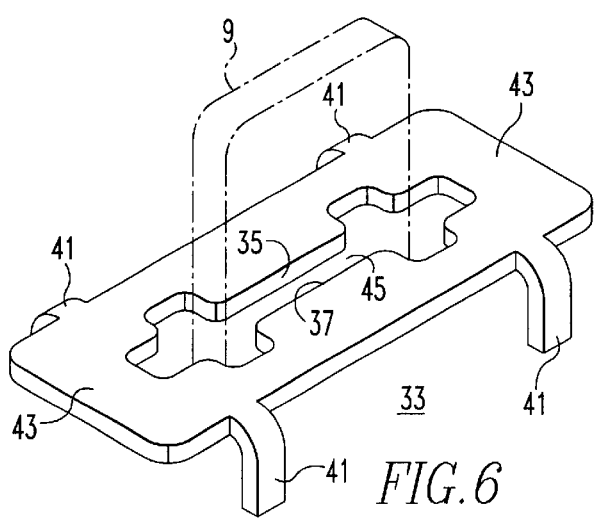
FIG. 6 is an isometric view of one of the copper contact strips of FIG. 5.

Referring to FIG. 5, another printed circuit board 31 is shown. The printed circuit board 31 is similar to the printed circuit board 11 of FIG. 3A, except that it includes a plurality of contact members 33. The contact members 33 (as best shown in FIG. 6) are mounted to the face 17 of the substrate 13 proximate corresponding ones of the through openings 19. Each of the contact members 33 includes a pair of opposing fingers 35,37 adapted to slide over and electrically engage a corresponding one of the electrical terminals 9 of FIG. 1. Similar to the printed circuit board 11, one or more electrical components (e.g., as shown by resistors 210 in hidden line view) are disposed on the other face 15 (shown in hidden line drawing), of the substrate 13 of the printed circuit board 31. The count of contact members 33 is preferably equal to or less than the count of the through openings 19, and is also preferably equal to or less than the count of the electrical terminals 9.

Continuing to refer to FIGS. 5 and 6, the printed circuit board 31 includes a plurality (e.g., four) of mounting holes 39 proximate some or all of the through openings 19. The contact members 33 include an exemplary count of four legs 41 adapted to engage corresponding ones of the mounting holes 39 of the printed circuit board 31. Preferably, the legs 41 are adapted to engage (e.g., by solder connection) the printed circuit board 31 at corresponding ones of the mounting holes 39 thereof. The contact members 33 also include a base 43, which supports the four legs 41. The base 43 has an opening 45 for the corresponding one of the electrical terminals 9 (as shown in phantom line drawing in FIG. 6). The pair of opposing fingers 35,37 extend from the base 43 and into the opening 45. As shown in FIG. 5, the resistors 210 are electrically connected to the mounting holes 39 and, thus, the corresponding contact members 33, by electrical traces 47 on the opposing printed circuit board face 15.

The contact members 33 are preferably made of a suitably conductive material such as, for example, copper, which is formed, for example, by stamping a strip of such material. The pair of opposing fingers 35,37 preferably flex slightly in order to both electrically engage and receive the corresponding electrical terminal 9 in the opening 45.

The simplistic design, low cost, interchangeability, and customizing potential of the instant switch customization invention is extremely valuable in the automotive field. The invention reduces manufacturing costs over known prior art not only by eliminating the tedious and time-consuming process of internally soldering or plugging in electrical components, but also by permitting one switch type to be modified for a variety of applications. Because the printed circuit boards 11,11',31 are not permanently soldered to the switch terminals 9, but are affixed after the switch is manufactured, the number of different switch types is reduced.

Additionally, adding an external printed circuit board 11,11',31 to an existing switch 1 dramatically increases the variety and complexity of functions such a switch can perform. The constraint of what components 21 can fit within the housing 3 of the switch 1 is no longer a concern. Electrical components 21 such as resistors 210, capacitors (not shown) and other electronic components can easily and inexpensively be soldered to the external printed circuit board 11,11',31. Because the circuit board 11,11',31 only covers a minimal portion of the switch terminals 9, such terminals remain available for electrical plug-in or solder connection to an electrical system, such as that of an automobile. Furthermore, one or more additional printed circuit boards, separated by suitable insulating layers, may be affixed to the relatively long terminals, thereby advantageously providing additional customization of the switch.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof

What is claimed is:

1. A switch assembly for an electrical system, said assembly comprising:
    a switch including a base having a first plurality of electrical terminals disposed thereon, said terminals having a free end opposite said base; and
    an interchangeable printed circuit board comprising:
        a substrate having first and second generally planar opposite faces with a second plurality of through openings extending between the first and second faces, at least one of said through openings sized to slide over and electrically engage at least one of the first plurality of terminals, the free end of said terminals being adapted for plug-in or solder electrical connection with said electrical system,
        at least one electrical component on at least one of the first and second faces of said substrate, and
        wherein said at least one electrical component comprise a plurality of resistors.

2. A switch customization assembly for an electrical system, said assembly comprising:
    a switch including a base having a first plurality of electrically conductive terminals, said terminals having a free end opposite said base; and
    an external interchangeable printed circuit board comprising:
        a substrate having first and second generally planar opposite faces with a second plurality of through openings extending between the first and second faces, at least one of said through openings adapted to slide over and electrically engage at least one of the terminals of said switch, said circuit board being proximate to the base of said switch, the free end of said terminals being adapted for plug-in or solder electrical connection with said electrical system,
        a third plurality of electrically conductive traces electrically connected to said openings, said traces being disposed on at least one of the first and second faces of said substrate,
        at least one electrical component on at least one of the first and second faces of the said substrate, said traces electrically connecting said at least one electrical component to some of said through openings, and
    wherein said at least one electrical component comprises a plurality of resistors.

* * * * *